(12) United States Patent
Carr

(10) Patent No.: US 6,888,141 B2
(45) Date of Patent: May 3, 2005

(54) RADIATION SENSOR WITH PHOTO-THERMAL GAIN

(75) Inventor: William N. Carr, Montclair, NJ (US)

(73) Assignee: MultiSpectral Imaging, Inc., Newark, NJ (US)

( * ) Notice: Subject to any disclaimer, the term of this patent is extended or adjusted under 35 U.S.C. 154(b) by 285 days.

(21) Appl. No.: 10/307,586

(22) Filed: Dec. 2, 2002

(65) Prior Publication Data

US 2004/0104344 A1 Jun. 3, 2004

(51) Int. Cl.[7] .................................................. G01J 5/00
(52) U.S. Cl. .............................. 250/338.1; 250/336.1; 250/330; 250/332; 250/338.3
(58) Field of Search ...................... 250/338.1, 336.1, 250/330, 332, 338.3

(56) References Cited

U.S. PATENT DOCUMENTS

| | | | |
|---|---|---|---|
| 4,401,104 A | * | 8/1983 | Kuzdrall .................. 126/585 |
| 4,594,507 A | | 6/1986 | Elliott et al. |
| 4,994,672 A | | 2/1991 | Cross et al. |
| 5,486,698 A | * | 1/1996 | Hanson et al. ............. 250/332 |
| 5,512,748 A | | 4/1996 | Hanson |
| 5,602,043 A | * | 2/1997 | Beratan et al. ............. 438/54 |
| 6,323,486 B1 | | 11/2001 | Grossman et al. |
| 6,770,882 B2 | * | 8/2004 | Carr et al. ............. 250/338.1 |

* cited by examiner

*Primary Examiner*—David Porta
*Assistant Examiner*—Christine Sung
(74) *Attorney, Agent, or Firm*—DeMont & Breyer, LLC

(57) ABSTRACT

A thermal sensor for low level radiation with built-in photo-thermal gain utilizing a thin film of pyro-optical material to modulate the reflectivity and/or transmission of a photonic carrier beam. The photonic carrier beam is modulated by the temperature of the pyro-optical film and detected by typically a silicon detector. A slight temperature increase of the pyro-optical film due to absorption of low level radiation increases the coefficient of absorption of the photonic carrier beam which in turn causes a further increase in temperature of the pyro-optical film. The photonic carrier beam provides power to increase the temperature of the pyro-optical film beyond the heating caused by the absorption of low level radiation alone. This thermal amplification effect provides a radiation sensor with photo-thermal gain.

21 Claims, 5 Drawing Sheets

RADIATION SENSOR WITH PHOTO-THERMAL GAIN

FIELD OF THE INVENTION

This invention relates to microsensors that are constructed utilizing semiconductor fabrication processes and, more particularly, to a thermal radiation sensor. The sensor is useful for detecting low level radiation absorbed in microstructures. This sensor is generally used for detecting infrared radiation. However, the low level radiation may be comprised of any electromagnetic radiation absorbed into a pyro-optical film within the radiation sensor and thus may include wavelengths ranging from the ultraviolet, visible, near infrared, far infrared, and into the millimeter wave regions. The present invention can be devised as a single sensor element or as an array of pixels including a focal plane array.

BACKGROUND OF THE INVENTION

There are many types of infrared or low level radiation sensor systems. The most widely used infrared imagers employ either photonic bandgap detection and thermal bolometer detection. Bandgap detectors for low level radiation are not the subject of the present invention. Most thermal detectors utilize sensor elements including thermistors, piezoelectric, ferroelectric, or multimorph deflection elements that incrementally change electrical characteristics with temperature. In each of these sensor types there is a direct electrical connection between the sensor element and the readout electronics or readout integrated circuit ROIC. A limitation in this type of radiation sensor is that the direct electrical connection mentioned serves to pick-up parasitic noise sources such as capacitive, inductive, and electromagnetic signal levels. The present invention has no electrical connection between the sensor structures sensitive to low level radiation and the readout ROIC and thus avoids many of the aforementioned parasitic noise problems.

Micromachining has been developed as a means for accurately fabricating small structures with micrometer and nanometer dimensions and is applied to structures for radiation sensors. Such processing involves the selective etching and deposition of layers of thin films. In addition various sacrificial layers are employed to enable the fabrication of relatively complex interactive structures. This technology is generally referred to as micro-optical electromechanical systems MOEMS technology and is utilized in a wide range of application devices. In the present invention we utilize MOEMS technology to fabricate microplatforms that contain a pyro-optical film as a key component of a radiation sensor which is used to modulate a second source of radiation as an interrogation carrier beam. These microplatforms are a key component within the radiation sensor which includes a second source of photonic radiation and a detector for readout of the modulated photonic beam. The pyro-optical film modulates the amplitude of the photonic beam to the detector in response to incremental heating from an incident low level radiation source. The second source of radiation is typically a visible or near infrared wavelength beam. The photon detector is typically a two-dimensional array of silicon charge coupled diodes (CCD) or CMOS silicon diodes with an imaging application. With low level radiation incident on the pyro-optical thin film, an incremental heating occurs which in turn causes a change in the transmissivity or reflectivity of the second source interrogation carrier beam. This change in the pyro-optical film characteristics modulates the amplitude of a photonic beam exiting to an ROIC detector. In the present invention the resulting signal output from the ROIC and associated circuitry is signal highly sensitive to the amplitude of incident low level radiation. The subject of the present invention in particular is the use of the carrier beam to cause further heating of the pyro-optical film and thereby provide a sensor with photo-thermal signal gain.

A thermal imager that includes an infrared sensitive light valve and a light source arranged to illuminate the valve was described by Elliott and Watton in U.S. Pat. No. 4,594,507. This imager contains an infrared sensitive optically active liquid crystal cell and an analyzer adjusted to near extinction. An optical processor comprising a lens and an apodized stop filter lies in the light path between the valve and the detector array. The thermal imager described in this patent uses an interrogation light beam but does not mention microplatforms, microstructures, or thermal gain.

An infrared sensor scheme is described by Hanson in U.S. Pat. No. 5,512,748 in which an infrared sensitive film is used to amplitude modulate a photonic carrier beam. This patent describes a focal plane array including a plurality of thermal sensors mounted on a substrate. An image is formed on an infrared sensitive film layer in response to infrared radiation from a scene. Electromagnetic radiation from a source is used to reproduce or transfer the image from the thermal sensors onto the first surface of the substrate. In the Hanson patent there is no mention made of a pyro-optical film in which the absorption of a visible or near infrared carrier beam increases with temperature to achieve a photo-thermal gain.

Cross et al in U.S. Pat. No. 4,994,672 describe an infrared imaging system which includes a pyro-optic film exhibiting a substantial change in refractive index in response to incremental changes in temperature. A high level light beam is projected onto the sensor and locally reflected in accordance with local changes in the refractive index of a pyro-optic film. This detector and imager description does not mention any structures or techniques for obtaining thermal gain.

It is an object of this invention to provide an improved radiation sensor wherein micromachining of a thermally isolated platform is used with selected pyro-optical thin films to accomplish a sensor with photo-thermal gain. This type of thermal gain is powered by the carrier beam.

It is another object of this invention to provide a pyro-optical sensor with an increased sensitivity to low level radiation wherein the readout noise and photonic noise contributions to the system output are relatively reduced. The result is a decrease in the net equivalent temperature differential NETD of a source of low level radiation that can be detected by the radiation sensor operating as an imager.

SUMMARY OF THE INVENTION

In the present invention we describe a radiation sensor for low level radiation where typically less than a nano Watt is absorbed in a pyro-optical microstructure. The radiation sensor contains an absorbing microplatform that is thermally isolated from a substrate, a high level carrier beam and source, and a sensitive detector for the carrier beam exiting the microplatform. The carrier beam is modulated by the pyro-optical thin film in the microplatform and detected by the ROIC. The carrier beam is partially absorbed in the pyro-optical film resulting in a significant heating effect in the film irrespective of the absorbed low level radiation.

Both the low level radiation to be sensed and the carrier photonic source are partially absorbed in the microplatform both causing an increase in temperature. The intensity of the photonic beam exiting the microplatform is amplitude modulated by the temperature of the pyro-optical film.

The radiation sensor microplatform is structurally- and thermally-coupled to a pyro-optical film where (1) a first source of low level radiation or heat is incident upon the sensor platform and partially absorbed causing an incremental heating of said film, (2) a second source of radiation comprised of a photonic beam is incident on said film causing a further incremental heating and where the absorption of said second source of radiation increases with temperature of the pyro-optical film, (3) where an incremental first heating of said film due to said first source causes an incremental increase in the coefficient of absorption for the photonic beam resulting in an overall incremental increase of platform temperature beyond that achieved by the first source of radiation alone, and (4) and where the combined temperature rise of the pyro-optical film due to both the first and second radiation sources is greater than that due to the first source of radiation alone. The intensity of the second source is modulated by the overall incremental temperature change in the sensor platform structure thereby causing an amplitude modulation of the detected signal in the ROIC. These elements functioning together comprise a sensitive thermal sensor with photo-thermal gain. The photo-thermal gain derives from the fact that the incremental temperature increase in the pyro-optical film for a given level of low level radiation is enhanced by carrier beam absorption in the pyro-optical film.

The thermal gain of the present invention can be described by examining the basic theory of optical absorption in the microplatform. The fraction of the carrier beam power absorbed in the pyro-optical thin film causes an increase of temperature in the thin film and a resulting increase in the thermal coefficient of absorption for the carrier beam within said film. The heating of the microplatform due to absorption of the low level radiation alone causes a yet further increase in the power absorbed from the carrier by the film. Therefore, when there is a high level source of radiation incident on the thin film serving as a thermal bias, the incremental effect of absorbed incident low level radiation is amplified that which would have been due to the absorption of the low level radiation alone. The photo-thermal gain can be further explained by a simple model.

FIG. 1 shows a pyro-optical film 100 incident low level radiation of amplitude $\Phi_{ir}$, incident carrier beam of amplitude $\Phi_{ci}$, and the modulated exit carrier beam of amplitude $\Phi_{co}$. A typical hysteresis loop characteristic 200 of a pyro-optical thin film as a function of temperature is shown in FIG. 2 where the temperature is initially increased and later decreased. In FIG. 2 the vertical axis is the amplitude $\Phi_{co}$ of the exit carrier beam with the amplitude $\Phi_{ci}$ of the incident carrier is constant. A quiescent operating reference point is defined by exit carrier amplitude $\Phi_{oo}$ and temperature $T_{oo}$. Consider a pyro-optical film heated initially from a low temperature to a quiescent temperature $T_{oo}$ without incident beams $\Phi_{ci}$ and $\Phi_{ir}$ enabled. As energy from the two incident beams $\Phi_{ci}$ and $\Phi_{ir}$ is absorbed in the pyro-optical film 100 the temperature of the film increases to the value T shown in FIG. 2. The relationship of Eq. 1 describes the existing carrier beam amplitude $\Phi_{co}$.

$$\Phi_{co}=\Phi_{oo}(1-k_{oo}T) \tag{1}$$

where $k_{oo}$ is a characteristic of the particular configured pyro-optical film and microplatform structure. The incremental heating $T-T_{oo}$ of the pyro-optical film is proportional to the absorbed fraction of the incident radiation $$T-T_{oo}=k_1\Phi_{ci}+k_2\Phi_{ir}\sim k_1\Phi_{ci} \tag{2}$$

where $T_{oo}$ is the quiescent temperature, $k_1$ is the coefficient for absorption of the carrier beam, and $k_2$ is the coefficient of absorption for the low level radiation beam. These k coefficients are specific to the particular microplatform structure containing the pyro-optical film.

Typically the absorbed energy from the incident high level radiation $\Phi_{ci}$ is much larger than that absorbed energy from the low level radiation $\Phi_{ir}$ and $T-T_{oo}=\sim k_1\Phi_{ci}$ The coefficient $k_1$ for absorption of the carrier beam in the thin film increases with temperature, $$k_1=k_{11}(1+k_{12}T) \tag{3}$$

From these relationships, the thermal gain factor G is obtained $$G=\Phi_{co}/\Phi_{ir}=A\Phi_{ci} \tag{4}$$

where A is a gain factor of the pyro-optical film to temperature caused by absorption of the incident carrier beam $\Phi_{ci}$. The sensor sensitivity to low level radiation $\Phi_{ir}$ increases with the amplitude $\Phi_{ci}$ of the incident high level carrier beam. The exit carrier beam can be transmitted through or reflected from the pyro-optical film and photo-thermal gain is achievable in either case.

DETAILED DESCRIPTION OF THE INVENTION

We describe a radiation sensor which contains an internal photonic carrier beam to monitor extremely small variations in the temperature of a microplatform. The reflection of transmission of the photonic carrier beam with respect to a microplatform is monitored by a detector. The present invention uses microoptical-electromechanical-systems MOEMS technology to form a single microplatform or an array of microplatforms for detecting low level radiation.

Figure 3:
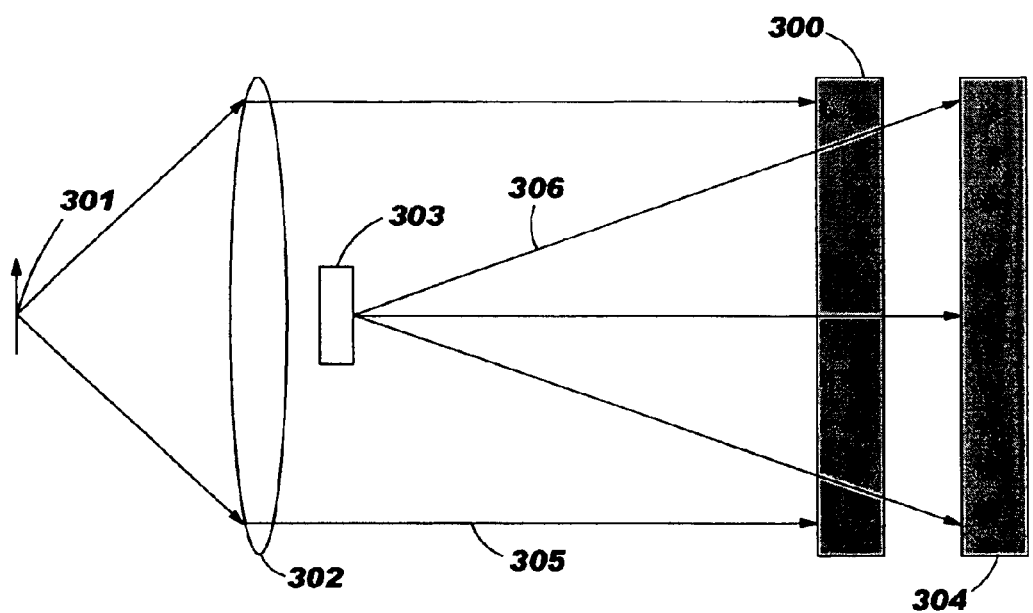
FIG. 3 is a schematic view of a radiation sensor system providing photo-thermal gain with transmission of the carrier beam through the MEMS plane.

FIG. 3 is the block diagram of a radiation sensor system constructed in accordance with the present invention. During operation for the application of thermal radiation detection, emission from scene 301 is received by structure 302 and focused on the microplatform 300. Structure 302 contains collection optics and also may contain a chopper in the beam of low level radiation 305. The beam 305 in FIG.

Figure 1:
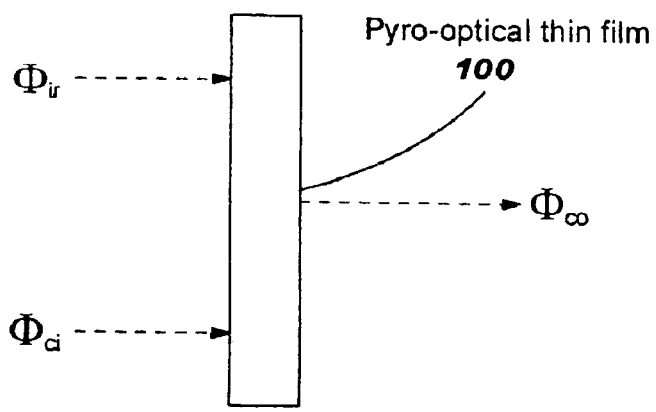
FIG. 1 defines incident and exit beams with a film of pyro-optical material.
Figure 2:
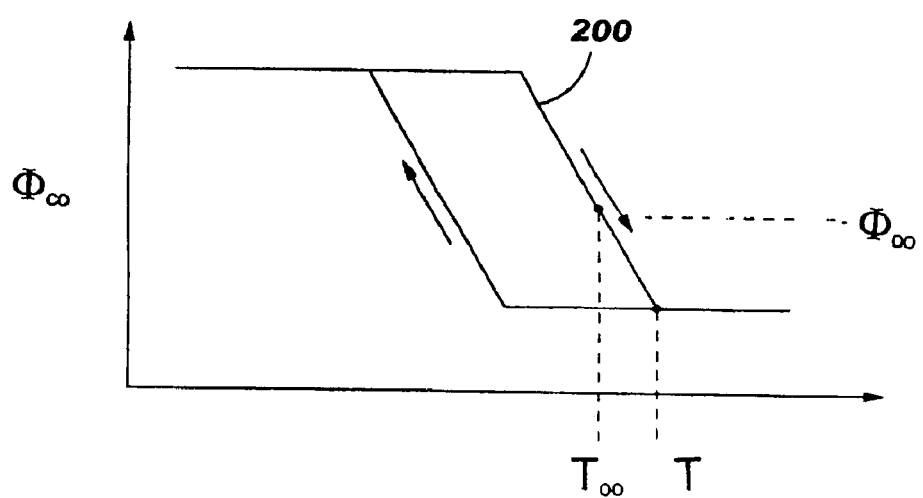
FIG. 2 is an example of a typical pyro-optical hysteresis with parameters defined.

3 corresponds to the incident low level beam $\Phi_{ir}$ of FIG. 1. The chopper acting in cooperation with gating circuits made part of 304 provides a synchronized means of reducing the biased and undesired signal levels. Source 301 may be any source of low level radiation that can be focused onto and absorbed into the microplatform or array of microplatforms 300. The low level radiation beam 305 is absorbed in the microplatform 300 causing an incremental increase in microplatform temperature. In a typical application the source 301 is a scene of objects that emit thermal radiation and the microplatform structure 300 consists of a MOEMS array which is heated by the incident beam 305 in a spatial pattern corresponding to the imaged scene. An interrogation radiation beam 306, typically a visible or near infrared wavelength, is modulated by the array 300 and readout by an array of corresponding detectors in the readout electronics 304. The portion of beam 306 incident on the microplatform array 300 corresponds to beam $\Phi_{ci}$ of FIG. 1. The portion of beam 306 exiting the microplatform array 300 corresponds to beam $\Phi_{co}$ of FIG. 1. The readout 304 may also contain circuits for image processing. The optics in 302 are well known in the art of thermal imaging and may be any one of a number of systems of lenses depending on the wavelength windows desired. Optics 302 focus the source 301 on the microplatform 300 in order to sense the radiance of the incident infrared radiation 305 it receives. Collection optics in 302 may include one or more lenses made of material that transmits infrared radiation such as germanium. The placement of optics 302 and optional chopper with respect to the microplatform 300 is accomplished using well known principles of optical design as applied to thermal imaging systems. The low level radiation 301 may alternatively be focused onto the microplatform 300 using Cassegrainian reflective optics instead of the lens contained within 302. Nonthermal sources of low level radiation such as photonic bursts of energy of visible or ultraviolet radiation can be focused onto the microplatform 300 to heat the microplatform. Low level radiation from millimeter/microwave sources can be directed or focused onto the microplatform by structures including directional antennas and reflectors. The low level radiation source may also be an infrared radiation-emitting chemical reaction or biological process including chemiluminescence and bioluminescence.

The invention can also be configured for use during the day or when vision by means of visual wavelengths is also available. Imaging of visual wavelengths can be obtained by disabling the carrier beam 303 and with an optics design that permits focusing a visible image from the 301 location onto the detector readout plane 304.

In FIG. 3 the carrier source 303 is provided for use in transferring the low level radiation spot or pattern formed on microplatform 300 further to photosensors 304 disposed in the path of the high level radiation beam 306. Photosensor 304 detects the beam 306 after it is modulated by transmission through the microplatform. The photosensor 304 can be an array for the case of imaging by configuring 300 into an array of microplatforms. Optical source 303 preferably provides electromagnetic radiation in the visible or near infrared spectrum to match the sensitivity spectrum of silicon used in the photodetector 304.

Electronics within 304 format the photodetector signal. Electronics are provided to perform selected operations on the photodetector output including digitization, synchronizing with the chopper, zooming, general image processing, formatting for a display with techniques well known to the art of imaging and low level signal processing. Image processing within 304 is used to eliminate the large biased signal component from 306 to provide an unbiased output representative of the intensity pattern of the low level incident beam 305. For the display application embodiment, a special viewing device such as a CRT or LCD display is driven by the electronics. The image on a display obtained through the electronics from the radiation sensor system is typically a visual representation of the radiance image of the microplatform 300 corresponding to points on the two dimensional scene 301. The radiation sensor system may include digitization electronics so that the signals can be stored and processed as digital data. This requires sampling, storage, image subtraction and processing circuits which are well known in the field of video and graphics processing and be included as part of the electronics within 304. The radiation sensor system may function as a radiometer to provide temperature measurements of radiant energy sources present in source 301 or other sources focused onto the microplatform 300.

A chopper wheel or other optical switching device is often used to synchronously interrupt the beam of low level radiation 305 to the microplatform 300 thereby providing a reference signal and a bias signal. Collection optics 302 and the chopper cooperate to form a reference temperature increment on the microplatform 300 corresponding to the background radiance. The electromagnetic energy 306 from light source 303 in cooperation with photosensor 304 will produce a signal corresponding to the total radiance filtered by the chopper from source 301 during any frame of time. Electronics included in the photodetector 304 and associated electronic processing will cooperate with each other to process the bias signal and the reference signal to generate an unbiased signal which may be transformed into a data stream for display or storage in a memory for later processing. The process of establishing a reference signal and receiving a biased signal is repeated in succession for a stream of video images in the case of imaging. The present invention contemplates either establishing a reference signal before or after the detection of a bias signal, or establishing a reference signal before or after a predetermined number of bias signals have been received and processed.

The electronics preferably include a control circuit to operate a thermoelecrtric cooler/heater to adjust the temperature of the substrate 300 to produce optimum sensitivity.

Figure 4:
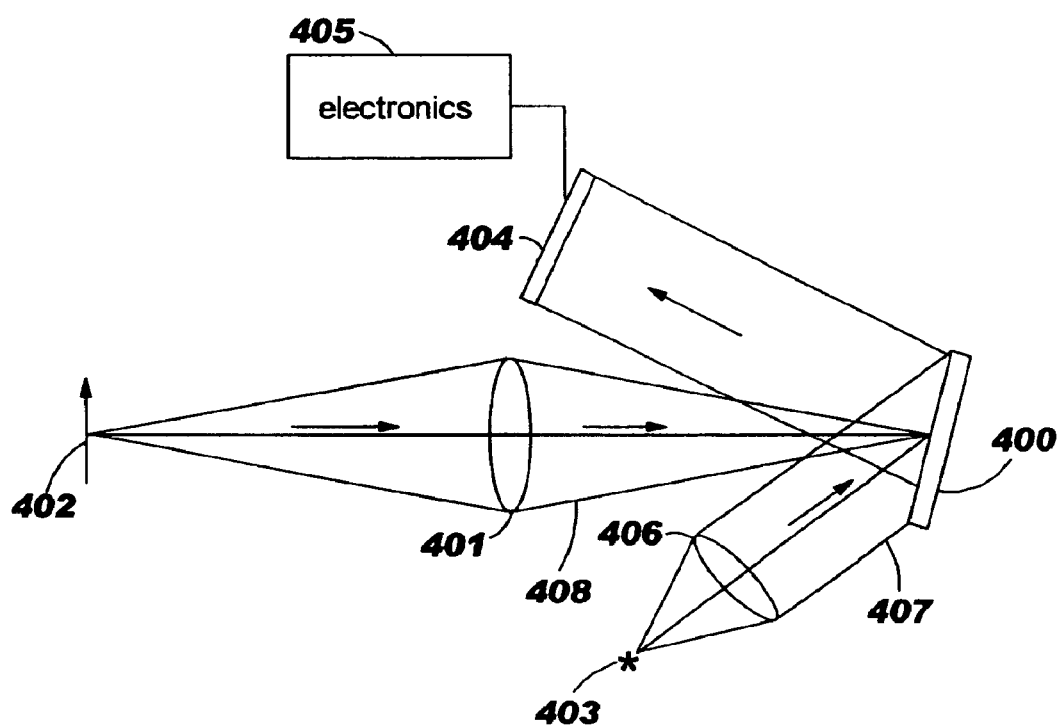
FIG. 4 is a schematic view of a radiation sensor system providing pyro-optical gain with reflection of the carrier beam from the MEMS plane.

FIG. 4 shows an embodiment with a microplatform 400 which modulates the intensity of the carrier beam 407 originating from source 403. This embodiment which modulates the carrier beam 407 by reflection differs from the case of FIG. 3 which modulates the transmitted carrier beam 306. In the reflection configuration of FIG. 4 a carrier beam source 403 is formed into a collimated or near collimated beam 407 by optics 406. The carrier beam 407 is reflected and modulated by the microplatform 404 and detected by the detector or detector array 404. The source 402 of low level radiation is focused by optics 401 onto the microplatform plane 400 thereby causing an incremental heating of the microplatform or array of microplatforms in correspondence to the cross section of the focused low level beam 408. The electronics 405 may be external from the photodetector 404 or may be integrated into the substrate of photodetector 404. The basic functions of the radiation sensor system of FIG. 4 are similar to that of the transmissive sensor system of FIG. 3 except that in the FIG. 4 case the carrier beam 407 is reflected from the MOEMS microplatform plane.

One embodiment of the FIG. 4 configuration places the carrier source 403 and the photodetector 404 within the cross section area of the low level beam 408 thereby providing an approximately normally-incident high level and low level illumination of the microplatform. In this embodiment both the carrier source 403 and the photodetector 404 partially shadow the incident low level radiation 408 onto the microplatform. This embodiment has the advantage of compactness and design simplicity.

Figure 5:
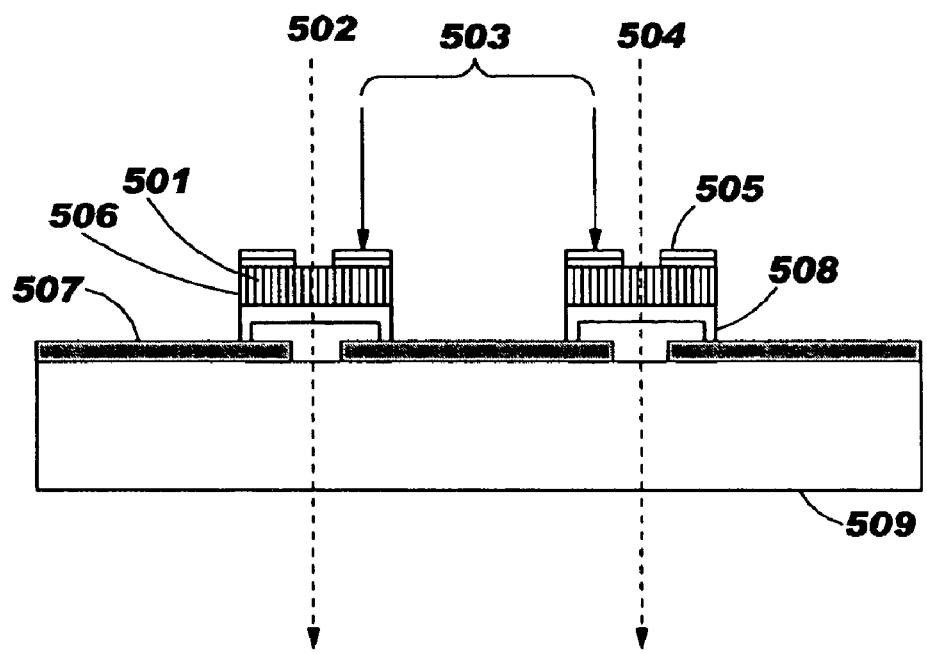
FIG. 5 is a schematic side view of a transmission-type microplatform pixel containing a pyro-optical film with photo-thermal gain.

A preferred embodiment of the microplatform in cross section is shown in FIG. 5 useful with the transmissive configuration of FIG. 3. This schematic shows two microplatforms 506 corresponding to elements in the MOEMS plane 400. The incident carrier beam 502 is modulated by the microplatform 506 and terminates in the photodetector disposed in alignment and adjacent to the substrate 509. The microplatform 506 includes pyro-optical film 506 and tether beam and support structure 508. The tether beams within 508 also serve to thermally isolate the pyro-optical film from the substrate 509. Disposed on the base plane 506 is the pyro-optical film 501 which modulates the intensity of the carrier beam 502. The incident low level radiation 503 is partially absorbed in the microplatform causing the desired incremental heating effect. A surface structure 505 can be added to the base plane 506 to increase absorption of the incident low level radiation beam 503. A patterned film 507 selectively transmits the carrier beam through to the photodetector. Patterned film 507 selects that portion of the beam which is modulated by the pyro-optic film and rejects that portion which is not modulated thereby maximizing the modulation index for the carrier beam at the detector. The microplatforms of FIG. 5 can be fabricated as an extended one or two dimensional array on substrate 509. Substrate 509 is optically transparent to the carrier beam 502.

The microplatforms of FIG. 5 are fabricated using micromachining technology involving patterned depositions and a sacrificial layer onto a substrate 509 of optically transparent material such as quartz. An opaque metal 507 preferably aluminum is sputtered onto the substrate 509 with a thickness of 200 nm and patterned. Next a sacrificial layer preferably polyimide is spun on and patterned to accommodate the anchors from the tether beams of the microplatform base 508. This sacrificial film, later to be removed, directly covers 507 and establishes the height structural platform film in 508. The silicon dioxide microplatform plane and tetherbeams are next deposited by CVD deposition two or more layers each with appropriate lithographic patterning. A pyro-optical film 506 preferably vanadium oxide is next deposited and processed at temperatures within a range that does not degrade the sacrificial film and patterned to cover the underlying structure 508. The pyro-optical film may also be formed from materials selected from the group including silicon, germanium, aluminum gallium arsenide, indium gallium arsenide, indium antimonide, antimony sulfoiodide, barium titanate, barium strontium titanatate, antimony sulphur iodide, and lead lanthanum zirconate titanate, and crystallites of various other semiconductors. Film layer 501 may be formed from liquid nematic crystals with absorption for the carrier beam which is temperature dependent. The pyro-optical material which is used to form film layer 501 will depend upon the wavelength of the high level radiation that is to be modulated, the response wavelength window of the photodetector, and the desired absorption of the low level beam 503 into film 501. Following deposition and patterning of the pyro-optical film 501 a topmounted film 505 is optionally deposited and patterned to facilitate the absorption of low level radiation 503. For enhancing infrared absorption, film 505 may be a carbon polymer. For enhancing very long wave infrared or millimeter wave absorption, film 505 can be a patterned metallic dipole antenna or resonator. The films 501 and 505 may be passivated with a protective film that is not attacked by the process step of removing the sacrificial film. A final processing step is the removal of the sacrificial film underlying the base plane 501. The polyimide sacrificial layer is removed using an oxygen plasma.

Figure 6:
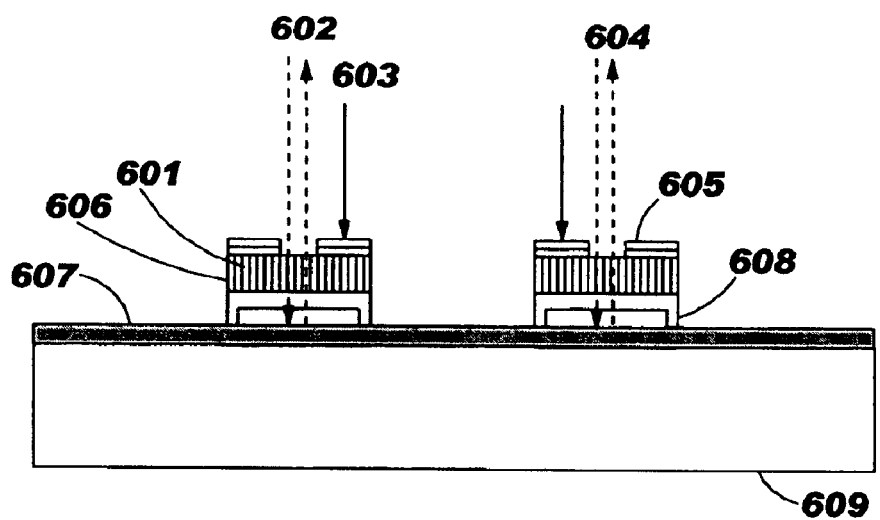
FIG. 6 is a schematic side view of a reflecting-type microplatform pixel containing a pyro-optical film with photo-thermal gain.

An alternative embodiment for the platform array is shown in FIG. 6. This embodiment is a microplatform useful with the reflected carrier beam configuration of FIG. 4. The reflective microplatform schematic containing two representative platforms in FIG. 6 is fabricated similarly to the embodiment of FIG. 5. The reflective microplatform structure may be a single microplatform or more typically an array of microplatforms that are physically matched to the configuration of the photodetectors as illustrated in FIG. 4. The film 607 covering substrate reflects the high level beam 602 which has a double-pass through the pyro-optical film 601. An additional modulation effect which increases the index of modulation is obtained with the double-pass of beam 602. The reflected beam 602 exits to the photodetector 404. The embodiment of FIG. 6 is fabricated on a convenient substrate such as silicon and does not need to be optically transparent to beam 602. The microplatform structures 606 containing the pyro-optical film 601 and the optional absorber film 603 are deposited and patterned on the metallic film 607 similarly as in the embodiment of FIG. 6.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A radiation sensor with thermal gain comprising:
   a microplatform including a pyro-optical film positioned above and thermally isolated from a substrate;
   a first source of low level radiation incident upon the microplatform and partially absorbed causing an incremental heating of said film;
   a second source of high level radiation comprised of a photonic beam incident on said film and partially absorbed heating the microplatform to a quiescent temperature;
   wherein the temperature coefficient of absorption of said second source increases with the temperature of said pyro-optical film;
   wherein an introduction of the first incremental heating causes the absorption of the second source to increase the temperature of the pyro-optical film with a second incremental heating that is greater than the first incremental heating; and
   a detector monitoring the intensity of the photonic beam exiting the sensor platform thereby providing an output signal measurement representative of the amount of low level radiation incident on the sensor and enhanced by the further incremental heating effect from the second source thereby providing photo-thermal gain in the microplatform structure.

2. The radiation sensor of claim 1 where the detector is formed within said substrate comprising silicon or other semiconductor material adjacent to the overlying microplatform.

3. The radiation sensor of claim 1 where the detector is located in position to receive the modulated radiation from the second source beam either reflected from or transmitted through the pyro-optical film.

4. The radiation sensor of claim 1 where the first and second sources of radiation are derived from a larger number of sources.

5. The radiation sensor of claim 1 operated in a vacuum for the purpose of increasing thermal isolation of the microplatform from said substrate.

6. The radiation sensor of claim 1 where the modulated intensity of the second source of radiation is monitored by either reflection from or transmission through said pyro-optical film.

7. The radiation sensor of claim 1 where the first source of radiation is within bandwidths ranging from ultraviolet to the far infrared or millimeter wavelengths.

8. The radiation sensor of claim 1 configured in an array of pixels and imaged to a detector comprised of a charge-coupled-diode or CMOS imager array with signal conditioning circuitry configured to output an electrical signal formatted for driving external image displays or databases.

9. The radiation sensor of claim 1 where the pyro-optical film is comprised of an oxide of vanadium maintained at a quiescent temperature between 30 and 70 deg C.

10. The radiation sensor of claim 1 where the pyro-optical film is comprised of a semiconductor or liquid crystal material in which absorption of the second radiation source increases with increasing temperature.

11. The radiation sensor of claim 1 disposed in the form of an array physically aligned over a matching array of photodetectors comprised of charge-coupled diodes, a CMOS imager, or a thermal imager, each sensitive to a wavelength component of the second radiation source.

12. The radiation sensor of claim 1 where the second radiation source is an ultraviolet, visible, or near infrared light source comprised of a light emitting diode, incandescent source, or a laser source.

13. The configuration of claim 1 where the second radiation source is disposed immediately adjacent to the microplatform to project radiation for absorption into the microplatform.

14. The radiation sensor of claim 1 where the low level radiation source is a radiation-emitting chemical reaction or biological process including chemiluminescence and bioluminescence.

15. The radiation sensor of claim 1 comprised of an array of microplatform pixels and mating detectors.

16. A radiation sensor including a means for photo-thermal gain for producing an image of a scene in response to incident infrared radiation from said scene, comprising:

optics for focusing low level incident infrared radiation emitted by the scene onto a microplatform array;

a chopper for the incident infrared radiation disposed between the optics and the microplatform array;

each microplatform disposed on a common substrate having a film layer including pyro-optical material which is incrementally heated by absorption of the low level incident radiation a detector with a plurality of photosensor pixels aligned with corresponding pixels of the microplatform array;

a light source disposed adjacent to the microplatform array to project a second source of radiation through the microplatform array onto the detector for the purpose of transferring thermal-images formed on the microplatform layer to the associated photosensor pixels;

said pyro-optical material with an absorption coefficient for the light source which increases with temperature thereby providing an overall increase in index of modulation beyond that obtainable with the heating effect of the low level radiation alone;

said microplatform array and the photosensors cooperating with the chopper and the light source to produce a biased signal and a reference signal; and electronics for receiving the biased signal and the reference signal and for subtracting the reference signal from the biased signal to obtain an unbiased signal representing radiance differences emitted by objects in the scene.

17. The radiation sensor of claim 16 wherein each microplatform pixel further comprises the microstructures:

a plurality of posts mounted on the substrate;

each post or plurality of posts attached to a structural arm for the purpose of supporting a microplatform; and wherein the posts cooperate with the respective arms to form a gap between the microplatform and the substrate equal to approximately one-quarter of a wavelength of the incident low level radiation.

18. The radiation sensor of claim 16 wherein the light source projects electromagnetic radiation from portions of the ultraviolet, visible and the near infrared spectrum.

19. The radiation sensor of claim 16 wherein the photosensors are selected from the group consisting of photoconductive cells, photodiodes, photoresistors, photoswitches, phototransistors, photovoltaic cells, and charge coupled devices.

20. The radiation sensor of claim 16 where the pyro-optical film is formed from vanadium oxide maintained at a quiescent temperature in excess of 30 degrees Centigrade.

21. The radiation sensor of claim 16 where the pyro-optical film is formed from material selected from the group consisting of gallium arsenide phosphide, gallium aluminum nitride, indium gallium arsenide, antimony sulfoiodide, barium titanate, barium strontium titanatate, antimony sulphur iodide, and lead lanthanum zirconate titanate.

* * * * *